(12) United States Patent
Sasahara et al.

(10) Patent No.: US 7,557,866 B2
(45) Date of Patent: Jul. 7, 2009

(54) AUTOMATIC GAIN CONTROL CIRCUIT

(75) Inventors: Hideaki Sasahara, Kawasaki (JP);
Nobuyoshi Ukaji, Hachioji (JP); Ken Ishihara, Atsugi (JP)

(73) Assignee: Asahi Kasei EMD Corporation, Tokyo (JP)

( * ) Notice: Subject to any disclaimer, the term of this patent is extended or adjusted under 35 U.S.C. 154(b) by 813 days.

(21) Appl. No.: 10/552,968

(22) PCT Filed: Apr. 6, 2004

(86) PCT No.: PCT/JP2004/004951

§ 371 (c)(1),
(2), (4) Date: Oct. 14, 2005

(87) PCT Pub. No.: WO2004/093442

PCT Pub. Date: Oct. 28, 2004

(65) Prior Publication Data

US 2006/0203128 A1 Sep. 14, 2006

(30) Foreign Application Priority Data

Apr. 15, 2003 (JP) ............................. 2003-110851

(51) Int. Cl.
*H04N 5/52* (2006.01)
*H04N 5/53* (2006.01)
(52) U.S. Cl. .................... 348/684; 348/682; 348/528
(58) Field of Classification Search ............... 348/528, 348/678–685, 707
See application file for complete search history.

(56) References Cited

U.S. PATENT DOCUMENTS 4,040,090 A * 8/1977 Haynes ....................... 348/533

(Continued)

FOREIGN PATENT DOCUMENTS

GB 2178264 A 2/1987

(Continued)

OTHER PUBLICATIONS

Search Report dated Mar. 17, 2008 in corresponding European Patent Application No. 04726023.7.

*Primary Examiner*—M. Lee
(74) *Attorney, Agent, or Firm*—Finnegan, Henderson, Farabow, Garrett & Dunner, LLP

(57) ABSTRACT

An AGC control section (110) has a first operation mode for controlling the gain of a variable gain amplifier (103) to maintain the amplitude of the sync signal measured by a sync signal amplitude measuring circuit (108) at a constant value, and a second operation mode for preventing the gain from being increased even when the amplitude of the sync signal measured by the video signal processing circuit (109) is smaller than the predetermined first reference value and reducing the gain of the variable gain amplifier (103) only when the amplitude of the video signal exceeds a predetermined second reference value. During operation in the first operation mode, when the amplitude of the sync signal is smaller than the predetermined first reference value and the amplitude of the video signal is greater than the predetermined second reference value, the mode is switched to the second operation mode. During operation in the second operation mode, when the amplitude of the sync signal becomes not less than the predetermined first reference value, the mode is switched from the second operation mode to the first operation mode.

4 Claims, 7 Drawing Sheets

U.S. PATENT DOCUMENTS

| | | | |
|---|---|---|---|
| 4,115,812 A | | 9/1978 | Akatsu |
| 4,204,229 A | | 5/1980 | Heuze |
| 4,292,598 A | * | 9/1981 | Yasumura ............ 330/281 |
| 4,963,969 A | * | 10/1990 | Kitaura et al. ......... 348/572 |

FOREIGN PATENT DOCUMENTS

| | | |
|---|---|---|
| GB | 2188501 A | 9/1987 |
| JP | 58-222680 | 12/1983 |
| JP | 5-75895 | 3/1993 |
| JP | 10-164458 | 6/1998 |
| JP | 2001-94826 | 4/2001 |

* cited by examiner

| INSUFFICIENT SYNC SIGNAL AMPLITUDE (OUTPUT 217 OF COMPARATOR 210) | EXCESSIVE VIDEO AMPLITUDE (INPUT TERMINAL 201) | DETECTION OF AN ABRUPT CHANGE IN PEDESTAL LEVEL (OUTPUT 221 OF COMPARATOR 220) | DETECTION OF NO-INPUT (OUTPUT 222 OF NO-INPUT DETECTING CIRCUIT) | MODE CHANGE |
|---|---|---|---|---|
| L | L | L | L | SHIFT TO FIRST OPERATION MODE |
| H | L | L | L | UNCHANGED |
| L | H | L | L | SHIFT TO FIRST OPERATION MODE |
| H | H | L | L | SHIFT TO SECOND OPERATION MODE |
| X | X | H | L | SHIFT TO FIRST OPERATION MODE |
| X | X | X | H | SHIFT TO FIRST OPERATION MODE |

X:DON'T CARE

FIG.3

| OPERATION MODE | OUTPUT OF MODE MANAGING SECTION 211 |
| --- | --- |
| FIRST OPERATION MODE | H |
| SECOND OPERATION MODE | L |

FIG.7

AUTOMATIC GAIN CONTROL CIRCUIT

TECHNICAL FIELD

The present invention relates to an automatic gain control (AGC) circuit.

BACKGROUND ART

Traditionally, a circuit is known that maintains the amplitude of a video signal. The circuit can maintain the amplitude of the sync signal, which is the difference between the pedestal level and the sync tip level of the video signal including the sync signal (such as a composite video signal and the Y signal of a Y/C separation signal). Such control is referred to as sync AGC.

More specifically, the ratio between the amplitude of the sync signal and the amplitude of the video signal representing white is a determined value as a standard. Accordingly, by controlling the amplitude of the sync signal at constant, the amplitude of the white portion of the video signal is also maintained at constant. As for images other than white, since the amplitude of the video signal is proportional to the brightness of the video signal and the white has the maximum amplitude, the amplitude of the video signal is uniquely determined, which corresponds to the brightness of the images.

The ratio between the amplitudes of the sync signal and the video signal representing white is set at 2:5 according to the ANSI/SMPTE170M standard (NTSC standard), and 3:7 according to another signal standard ITU-R BT.470 (PAL standard).

Other than this, a method is also known that maintains the peak value of the video signal at a fixed value. This control is referred to as peak AGC. The peak AGC also maintains the peak value of the video signal at constant, like sync AGC, by forming a negative feedback loop.

An AGC circuit disclosed in Japanese Patent Application Laid-open No. 10-164458 is an example that combines the sync AGC with the peak AGC, in which the sync AGC and the peak AGC operate simultaneously. Among input signals, there can be a video signal having amplitude exceeding the maximum amplitude of the video signal (amplitude of the white portion) determined from the amplitude of the sync signal according to the standard. As such, while the amplitude of the sync signal is less than the appropriate value, the amplitude of the video signal can exceed the maximum amplitude. In this case, a racing condition can occur between the operation to increase the gain by the sync AGC due to an insufficient sync signal and the operation to decrease the gain by the peak AGC due to an excess video signal.

In this condition, the control becomes unstable (or oscillates). Therefore, the time constant of the control loop of the peak AGC is set to shorter than that of the sync AGC, thereby preventing the control system from becoming unstable (see FIG. 5).

An AGC circuit disclosed in Japanese Patent Application Laid-open No. 2001-094826 employs a method categorized as peak AGC. This method provides three kinds of threshold values L1, L2 and L3 (L1>L2>L3) for the peak value of the video signal: when the peak value exceeds L1, its excess value is output as an error; when the peak value is greater than L2 and is less or equal to L1, zero is output as an error; when the peak value is greater than L3 and is less or equal to L2, a predetermined fixed error value is output; and when the peak value is less or equal to L3, zero is output as an error.

In this way, an excessive gain fluctuation is controlled such that the gain is reduced when the peak value of the video signal is in excess (greater than L1), the gain is maintained when it is at an appropriate level (greater than L2 and less or equal to L1), the gain is increased when the peak value is insufficient (greater than L3 and less or equal to L2), and the gain is maintained when the video signal is close to black (less or equal to L3) (see FIG. 4).

As for an apparatus that processes a given video signal to record or play back, it is desirable that once the optimum gain has been determined, the gain of the AGC is not varied unless the source of the video signal is switched.

As the sync AGC assumes that the ratio between the amplitude of the sync signal and the amplitude of the video has a predetermined value as described above, and has an advantage of not being dependent to the brightness of the images, it can easily achieve the desired characteristic.

However, as for actual input video signals, the ratio between the amplitudes of the sync signal and the video signal can often vary as signal distortions can occur due to a receiving condition of a radio wave or a recording condition onto a video tape.

Also, the sync signal is sometimes replaced during video editing, in which case the ratio between the amplitude of the images and the amplitude of the sync signal can go wrong.

As described above, a signal may be input with the ratio between the amplitudes of the video signal and the sync signal being deviated from the predetermined value. In many cases, the video signal may be input having an amplitude exceeding the maximum amplitude of the video signal determined from the amplitude of the sync signal according to the standard. Therefore, with a simple sync AGC, a problem can occur such that even if the gain is appropriate for the sync signal, the gain can be excessive for the video signal. When the gain of the AGC is excessive for the video signal, a large distortion occurs on the video signal, deteriorating the quality of the video. Disadvantages of the sync AGC are indicated in the foregoing prior arts.

The peak AGC, on the other hand, has an advantage in that the AGC can work even without the sync signal, and the video signal can be prevented from becoming excessive while the sync signal is appropriate as mentioned above.

For the peak AGC, however, even if the amplitude of the input video signal is at a peak value, it does not always mean the white level, nor ensure that it will be the maximum value of the video signal amplitude going forward. As such, the decision as to whether the gain to be increased or decreased has to rely on the brightness of the images around the detected peak, and hence, for a single signal source, the gain will always fluctuate depending on the brightness of the images. However, the gain fluctuation depending on the brightness of the images is undesirable for the apparatus that records or displays the video signal.

Japanese Patent Application Laid-open No. 2001-094826 proposes a method for improving the problem. The method has a certain range in the amplitude of the video signal, in which the amplitude of the video signal is determined to be appropriate and the gain is maintained. In addition, by suspending the gain control while in dark images, it is devised to prevent the gain from fluctuating depending on the brightness of the images. However, the range considered to be appropriate can vary from images to images. Therefore, it is configured to be able to input an appropriate level externally. However, it is unlikely that a single level can cover all possible images. Also, the problem of the gain fluctuation depending on the brightness of the video signal cannot be resolved completely.

Japanese Patent application laid-open No. 10-164458 proposes a method that combines the sync AGC and the peak AGC. The method, considering the case where both controls race each other, is directed to set the time constant of the peak AGC shorter than that of the sync AGC, thereby giving a priority of operation to the peak AGC and securing the stability of the control.

However, it only happens when the images are bright that priority is given to the peak AGC when the two controls are in race and hence the gain is restricted to prevent the peak amplitude from becoming too large. In this case, since the amplitude of the sync signal becomes smaller than a target value, the gain is increased by the normal sync AGC operation if the images become dark again. As such, the method cannot eliminate the possibility of the gain fluctuation depending on the brightness of the images with the same video signal source.

As described above, an AGC circuit is desired which can solve the foregoing problems and maintain the amplitude of the video signal at constant.

DISCLOSURE OF THE INVENTION

According to an embodiment of the present invention, an automatic gain control circuit is provided having a sync signal amplitude measuring means for measuring amplitude of a sync signal via a variable gain amplifier with an input of a video signal having the sync signal superposed; and a video signal amplitude measuring means for measuring amplitude of the video signal, the automatic gain control circuit comprising: a first operation mode for controlling a gain to maintain the amplitude of the sync signal measured by the sync signal amplitude measuring means at a predetermined first reference value, and a second operation mode for preventing the gain from being increased even when the amplitude of the sync signal measured by the sync signal amplitude measuring means is insufficient and reducing the gain only when the amplitude of the video signal measured by the video signal amplitude measuring means exceeds a predetermined second reference value.

In this way, it can maintain the amplitude of the video signal at a fixed level while preventing the amplitude of the video signal from exceeding the predetermined second reference value independent of the brightness of the images.

Also, by switching the mode, the control is restricted to one target, and thus no racing condition can occur due to multiple control targets, thereby realizing a stable control.

BRIEF DESCRIPTION OF THE DRAWINGS

FIG. 3 is a table showing mode transition conditions;

FIG. 7 is a table illustrating correspondence between the operation modes and outputs of the mode managing section 211 of FIG. 2.

BEST MODE FOR CARRYING OUT THE INVENTION

Embodiments of the invention will now be described with reference to the drawings.

Figure 1:
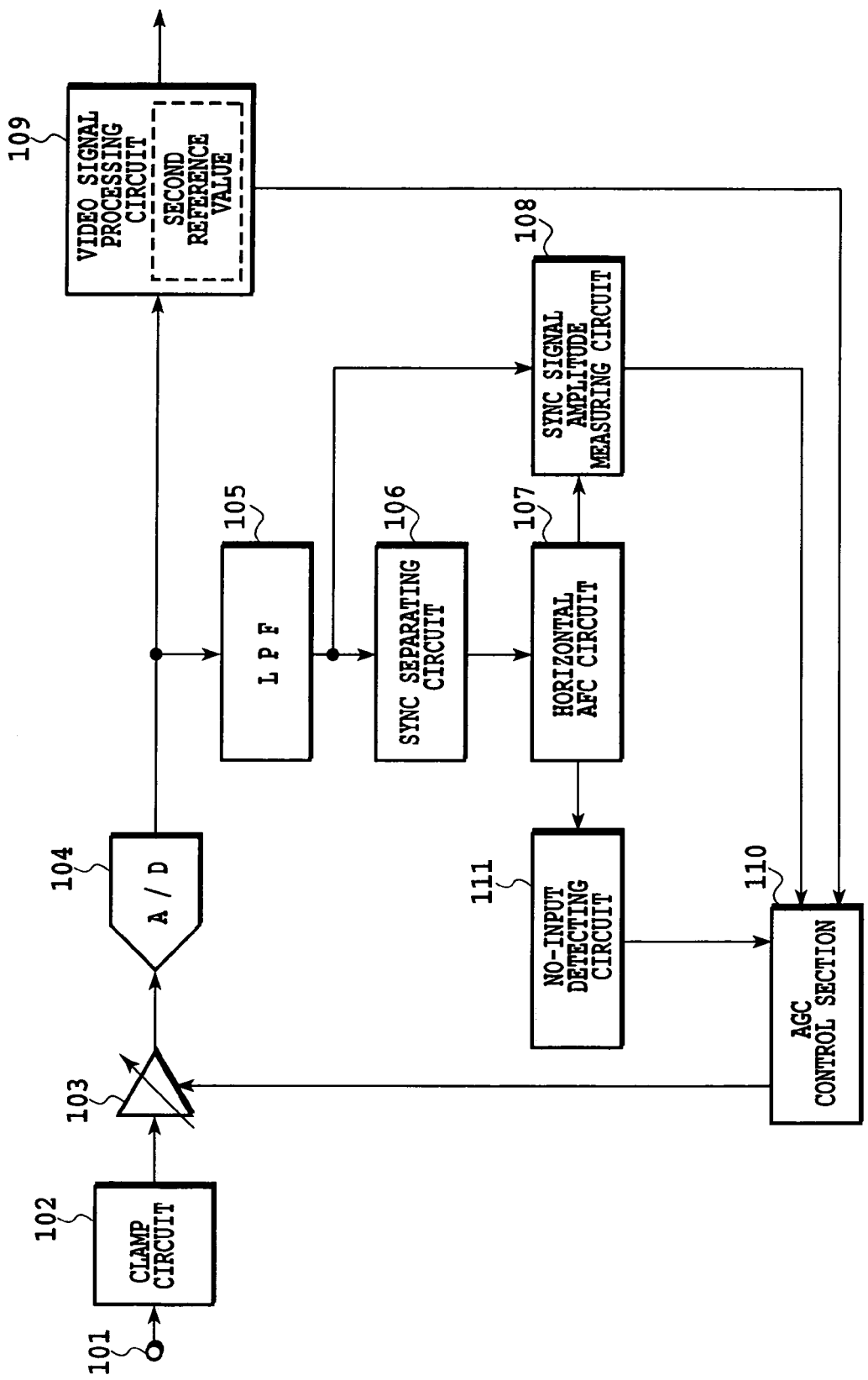
FIG. 1 is a block diagram showing an embodiment of the present invention.

FIG. 1 shows an embodiment of the invention. In FIG. 1, a clamp circuit 102 maintains the voltage of a sync tip at a constant voltage in respect to a video signal including a sync signal such as a composite video signal or the Y signal of a Y/C separation signal (sync tip clamp), which is input to an input terminal 101. A variable gain amplifier 103 can vary its gain with a control input, and amplifies or attenuates the video signal from the clamp circuit 102 in accordance with a gain determined by an AGC control section 110. An A/D converter 104 converts the video signal from the variable gain amplifier 103 into a digital signal. A low-pass filter 105 is to eliminate the chrominance signal included in the composite video signal from the A/D converter 104 and is required for preventing an error of a sync separating circuit 106.

The sync separating circuit 106 separates a composite sync signal from the signal passed through the low-pass filter 105. A horizontal AFC (automatic frequency control) circuit 107 estimates the position of the composite sync signal separated by the sync separating circuit 106, and outputs a signal indicating the position of a sync tip and the position of a back porch. Although the horizontal AFC circuit 107 is not always required to determine the position of the sync tip or the position of the back porch, the horizontal AFC circuit 107 can reduce the risk of erroneous operation when noise is included in the video signal. A sync signal amplitude measuring circuit 108 measures the level of the sync tip and the level of the back porch (i.e., the pedestal level) of the signal passed through the low-pass filter 105 every time the horizontal sync signal appears, and measures the amplitude of the sync signal by taking the difference between the two levels. A no-input detecting circuit 111 receives the output of the horizontal AFC circuit 107 to determine whether a video signal is present at the input terminal 101 or not, and outputs a logical low level (hereinafter, referred to as "L") when video signal is present, and a logical high level (hereinafter, referred to as "H") when video signal is not present.

On the other hand, a video signal processing circuit 109 performs signal processing on the digital signal from the A/D converter 104 required for the television signal processing such as the Y/C separation and chrominance demodulation. The video signal processing circuit 109 includes a circuit for determining whether the amplitude of the video signal is greater than a predetermined second reference value.

An AGC control section 110 generates a control value of the variable gain amplifier 103 from the decision output from the video signal processing circuit 109 as to whether the video signal is greater than the predetermined second reference value and from the amplitude of the sync signal fed from the sync signal amplitude measuring circuit 108, and then controls the gain of the variable gain amplifier 103.

Figure 2:
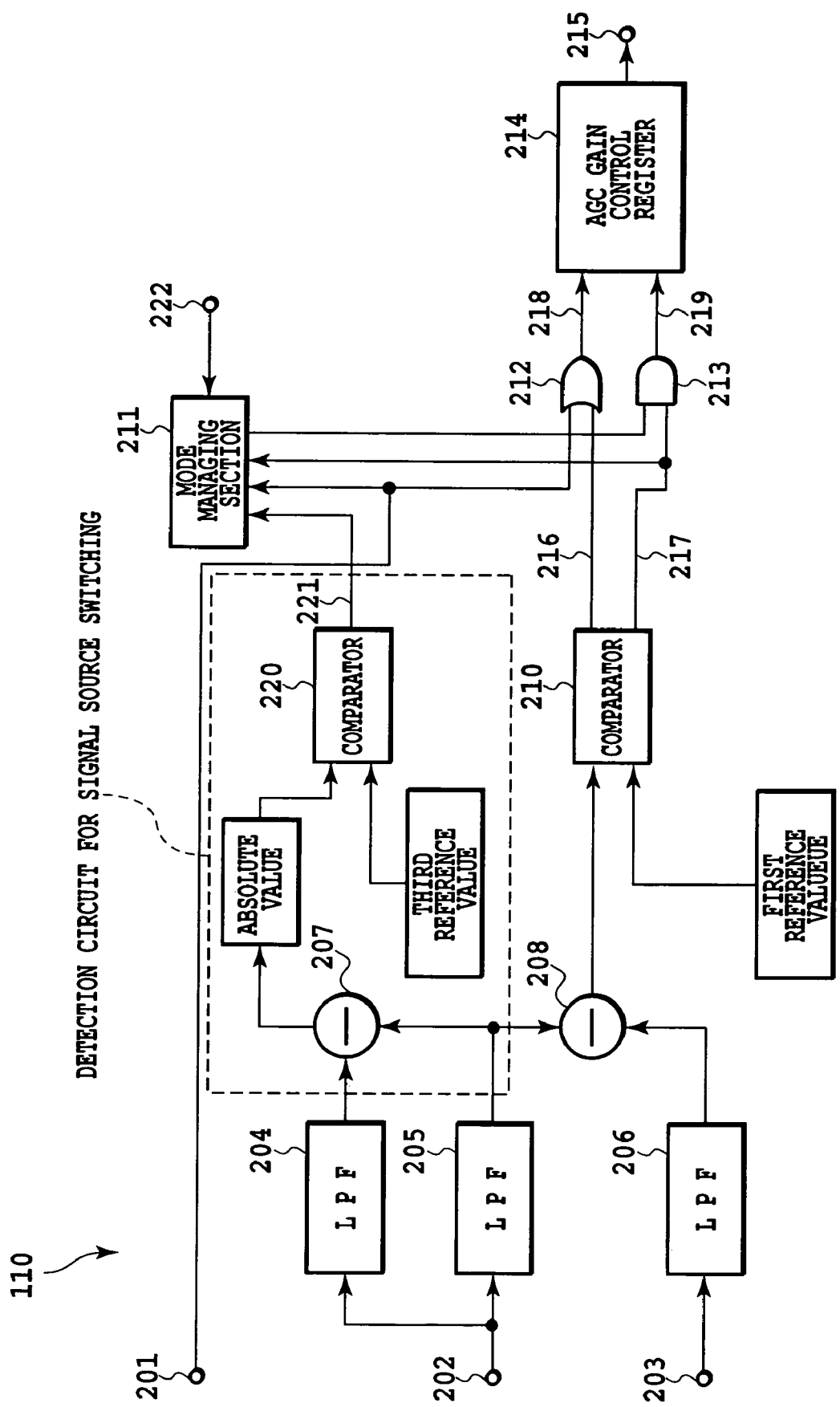
FIG. 2 is a block diagram showing a configuration of the AGC control section 110 of FIG. 1.
Figure 4:
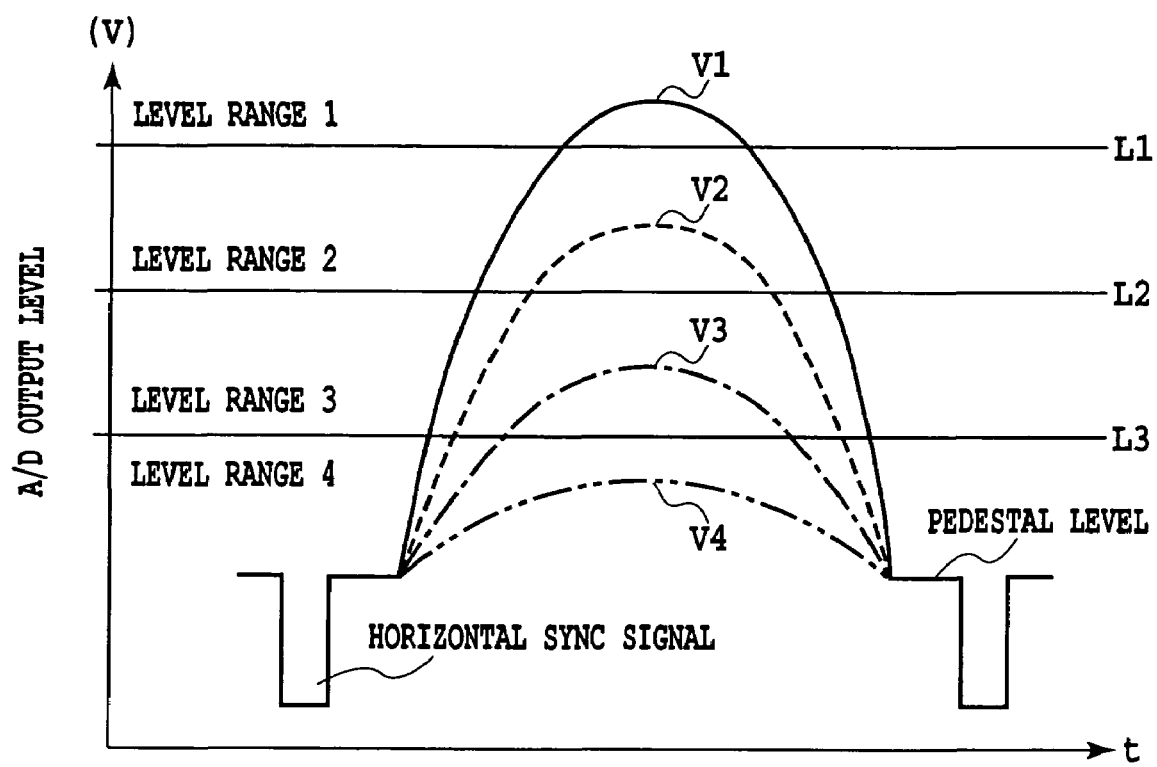
FIG. 4 is a graph illustrating relationships between amplitudes and threshold values of video signals in a prior art.
Figure 5:
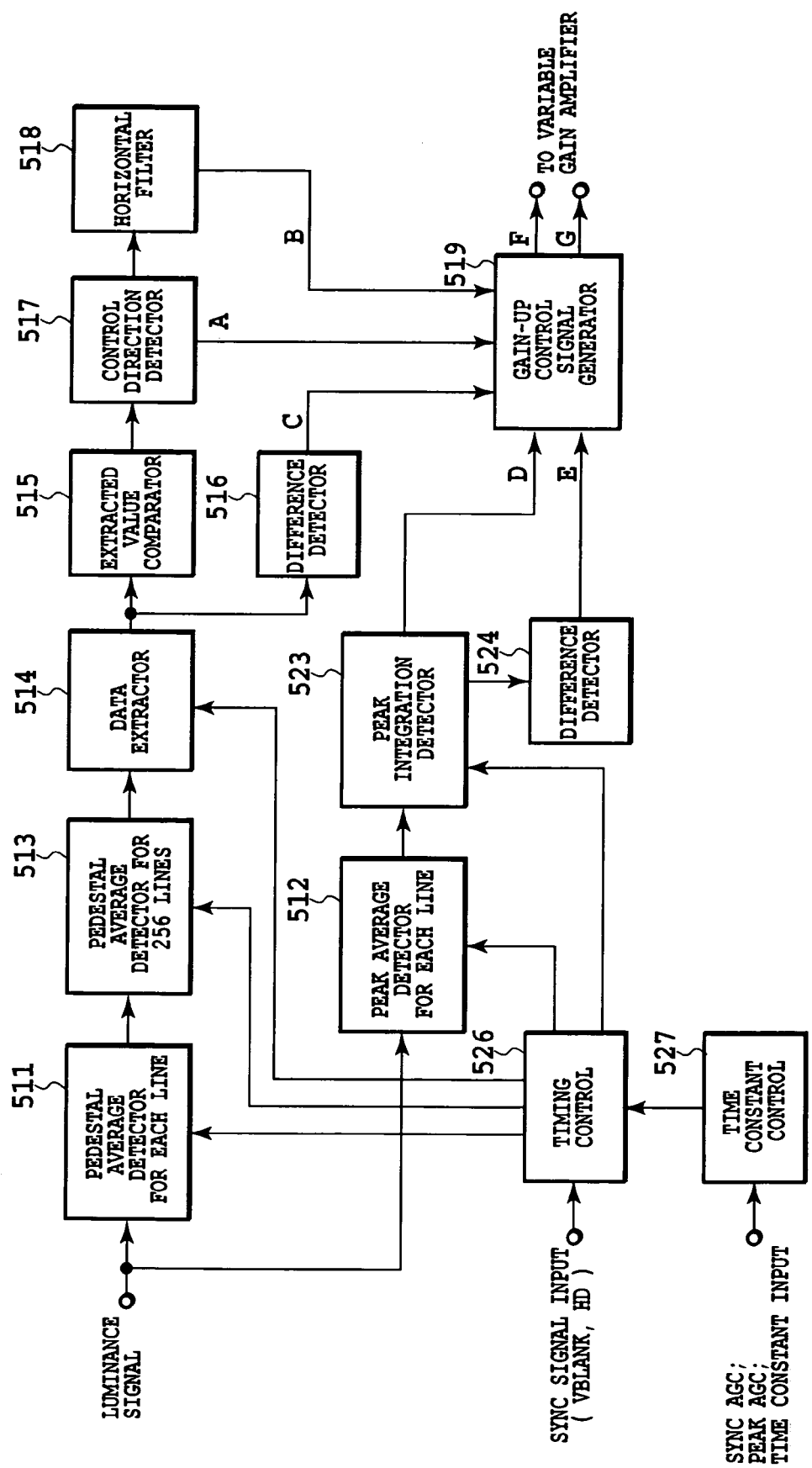
FIG. 5 is a block diagram showing a configuration of a conventional AGC control section.

FIG. 2 shows a configuration of the AGC control section 110 of FIG. 1. In FIG. 2, an input terminal 201 is a port to which a signal is input, which is fed from the video signal processing circuit 109 of FIG. 1, indicating that the amplitude of the video signal is greater than the predetermined second reference value. An input terminal 202 is a port to which a value is input, which is fed from the sync signal amplitude measuring circuit 108 of FIG. 1, indicating the pedestal level. An input terminal 203 is a port to which a value is input, which is fed from the sync signal amplitude measuring circuit 108 of FIG. 1, indicating the sync tip level.

Low-pass filters 205 and 206 are provided to eliminate micro fluctuations in the pedestal level and sync tip level varying at the horizontal period, and prevents the AGC gain from oscillating unduly. For the output of the low-pass filters 205 and 206, appropriate time constants are selected so as to have an average value of the pedestal level or sync tip level over the previous one frame or one field.

Figure 6:
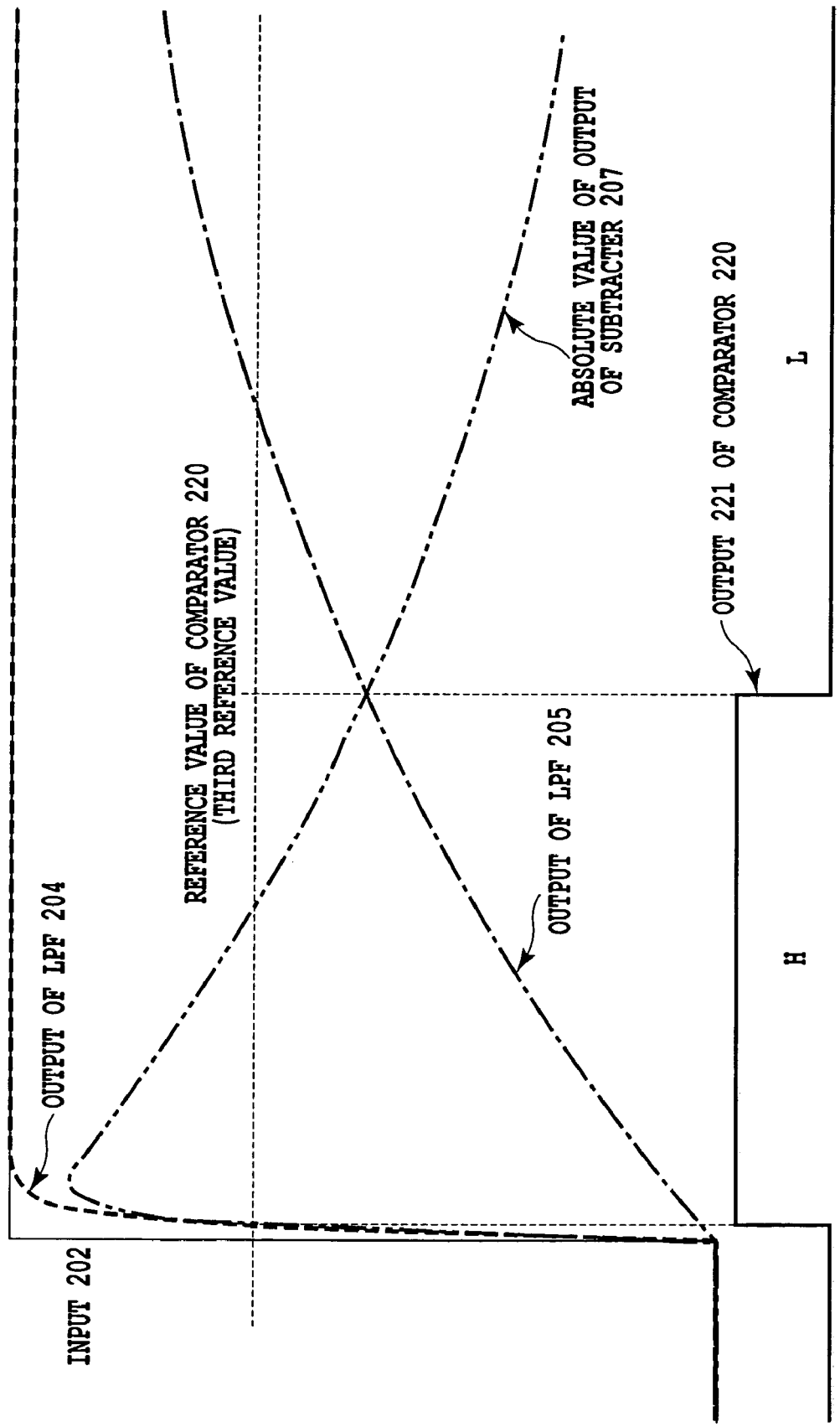
FIG. 6 is a diagram illustrating the operation principle of a detection means for signal source switching.

A low-pass filter 204 has a time constant sufficiently smaller than that of the low-pass filter 205. As illustrated in FIG. 6, because of the difference between the time constants of the low-pass filters 204 and 205, a subtracter 207 produces a difference at its output when the pedestal level applied to the input terminal 202 changes suddenly.

A comparator 220 compares the absolute value of the output of the subtracter 207 with a predetermined third reference value and determines that the signal is switched if it is greater, with an output of "H". The output 221 of the comparator 220 indicates switching of the signal as mentioned above and is connected to a mode managing section 211.

A subtracter 208 generates the difference between the pedestal level fed from the low-pass filter 205 and the sync tip level fed from the low-pass filter 206 to obtain the amplitude of the sync signal.

A comparator 210 compares the amplitude of the sync signal from the subtracter 208 with the predetermined first reference value: when the amplitude of the sync signal is greater than the predetermined first reference value, the output 216 becomes "H"; when the amplitude of the sync signal is less than the predetermined first reference value, the output 217 becomes "H"; and when the amplitude of the sync signal is equal to the predetermined first reference value, neither the output 216 nor 217 becomes "H". Since the variable gain amplifier 103 employed in the present embodiment (FIG. 1) is of a digital control type and has a discrete gain setting, it has a range in which the output value of the subtracter 208 is determined to be equal to the predetermined first reference value. The predetermined first reference value is the target value of the amplitude of the sync signal, and varies according to the bit width of the A/D converter 104 or the standard of the signal (such as NTSC or PAL). In the present embodiment, a 10-bit A/D converter is used, and the predetermined first reference value is 224 for NTSC and 236 for PAL.

A mode managing section 211 sets the logic level of the output terminal at "H" (indicating the first operation mode) or at "L" (indicating the second operation mode) based on the logic level of the output 217 of the comparator 210, the logic level of the input terminal 201, the logic level of the output 221 of the comparator 220 and the logic level of the output 222 of the no-input detecting circuit 111 (FIG. 1). FIG. 3 shows the correspondence between the inputs to the mode managing section 211 and the operation modes. Also, FIG. 7 shows the correspondence between the operation modes and the outputs of the mode managing section 211.

An OR gate 212 carries out the OR operation of the logic level at the input terminal 201 and the logic level at the output 216 of the comparator 210. An AND gate 213 carries out the AND operation of the logic level at the output of the mode managing section 211 and the logic level at the output 217 of the comparator 210.

An AGC gain control register 214 has two input terminals 218 and 219, and has its output terminal coupled to the gain control terminal of the variable gain amplifier 103 (FIG. 1). Here, when the output 218 of the OR gate 212 is "H" and the output 219 of the AND gate 213 becomes "L", the AGC gain control register 214 reduces its value by one, thereby reducing the gain setting value by one step (reducing gain). In contrast, when the output 218 is "L" and the output 219 becomes "H", the AGC gain control register 214 increases its value by one, thereby increasing the gain setting value by one step (increasing gain).

To reduce the gain of the variable gain amplifier 103, it is necessary that the amplitude of the sync signal is greater than the predetermined first reference value, or that the video signal is greater than the predetermined second reference value. In contrast, to increase the gain of the variable gain amplifier 103, it is necessary that the amplitude of the sync signal is smaller than the predetermined first reference value.

Next, the operation of the AGC control section 110 will be described with reference to FIG. 2. In the initial state, the mode managing section 211 sets its output logic level at "H" to set the first operation mode. Assume that the input is a signal with the amplitude of the sync signal being smaller than ⅔ of the amplitude of the video signal representing white, and that the amplitude of the video signal is small as a whole. Then the logic level of the input terminal 201 is "L", the logic level of the output 216 of the comparator 210 is "L", and the logic level of the output 217 is "H". Accordingly, the logic level of the output of the OR gate 212 is "L", and the logic level of the output of the AND gate 213 is "H", and this increases the value of the AGC gain control register 214 by one. Thus, the gain setting value is increased by one, and the gain of the variable gain amplifier 103 is increased.

This operation usually continues until the amplitude of the sync signal becomes equal to the predetermined first reference value. However, considering the ratio between the amplitude of the video signal representing white and the amplitude of the sync signal, since the amplitude of the sync signal is smaller than the value specified by the standard, the amplitude of the video signal exceeds the predetermined second reference value before the amplitude of the sync signal reaches the predetermined first reference value.

When the amplitude of the video signal becomes greater than the predetermined second reference value while the amplitude of the sync signal is smaller than the predetermined first reference value, the logic level of the input terminal 201 becomes "H". As a result, the logic level of the output of the OR gate 212 becomes "H". However, since the logic level of the output 219 of the AND gate is remained at "H", the control directions of the gain come into race.

However, the mode managing section 211 switches the mode from the first operation mode to the second operation mode, and sets the logic level of its output at "L" based on the fact that while the logic level of the output 221 of the comparator 220 is "L" and the logic level of the output 217 of the comparator 210 is "H", the logic level of the input terminal 201 shifts from "L" to "H".

When the logic level of the output of the mode managing section 211 becomes "L", while the output 218 of the OR gate 212 is remained at "H", the logic level of the output 219 of the AND gate 213 becomes "L". Thus, the value of the AGC gain control register 214 is reduced by one. Accordingly, the gain setting value is reduced by one step, and therefore the gain of the variable gain amplifier 103 is reduced.

After that, the second operation mode is maintained as long as the amplitude of the sync signal is smaller than the predetermined first reference value, and the current gain setting is maintained unless the amplitude of the video signal becomes greater than the predetermined second reference value. This enables to prevent the undesired flicker due to the gain fluctuations depending on the brightness of the screen.

If the amplitude of the sync signal does not happen to become smaller than the predetermined first reference value during the operation in the second operation mode, the operation mode is shifted to the first operation mode immediately, controlling the gain to make the amplitude of the sync signal equal to the predetermined first reference value. In other words, the normal sync AGC operation is carried out.

Thus, the automatic gain control circuit has the first operation mode and the second operation mode; it shifts to the second operation mode when detecting the state in which the amplitude of the sync signal is smaller than the predetermined first reference value and the amplitude of the video signal is greater than the predetermined second reference value; and reduces the gain until the state in which the amplitude of the video signal is greater than the predetermined first reference value is eliminated. Then, after the amplitude of the video signal is attenuated to a level lessor equal to the predetermined second reference value, the gain setting is maintained, thereby enabling the gain control independent of the brightness of the screen. In other words, the flicker of the screen can be suppressed because the gain fluctuations depending on the brightness of the screen are eliminated.

Although the present embodiment is described by way of example using the variable gain amplifier 103 of the digital control type, this is not essential. For example, similar advantages can be achieved by using a voltage control type variable gain amplifier instead of the variable gain amplifier 103, and connecting to the AGC control section 110 to the voltage control type variable gain amplifier via a D/A converter.

In addition, although the present embodiment is described byway of example that carries out the gain control operation with the digital circuit, similar gain control can be achieved by using a microprocessor in place of the digital circuit.

INDUSTRIAL APPLICABILITY

The automatic gain control circuit can maintain the amplitude of the video signal at a fixed level while preventing the amplitude of the video signal from exceeding the predetermined second reference value, independent of the brightness of the screen in the same video signal source.

In addition, by switching the mode, it enables to limit the control to one target and prevent the racing of the control by having a multiple control target values, thereby achieving a stable control.

The invention claimed is:

1. An automatic gain control circuit having a sync signal amplitude measuring means for measuring amplitude of a sync signal via a variable gain amplifier with an input of a video signal having the sync signal superposed; and a video signal amplitude measuring means for measuring amplitude of the video signal, the automatic gain control circuit comprising:

a control means for controlling the variable gain amplifier according to a first operation mode and a second operation mode, wherein the first operation mode controls a gain to maintain the amplitude of the sync signal measured by the sync signal amplitude measuring means at a predetermined first reference value, and wherein the second operation mode prevents the gain from being increased even when the amplitude of the sync signal measured by the sync signal amplitude measuring means is insufficient, and reduces the gain only when the amplitude of the video signal measured by the video signal amplitude measuring means exceeds a predetermined second reference value.

2. The automatic gain control circuit of claim 1, further comprising an operation mode switching means for switching to the second operation mode when, during operation in the first operation mode, the amplitude of the sync signal measured by the sync signal amplitude measuring means is smaller than the predetermined first reference value and the amplitude of the video signal measured by the video signal amplitude measuring means is greater than the predetermined second reference value; and for switching from the second operation mode to the first operation mode when, during operation in the second operation mode, the amplitude of the sync signal measured by the sync signal amplitude measuring means becomes not less than the predetermined first reference value.

3. The automatic gain control circuit as claimed in claim 2, further comprising a no-input detection means for detecting a no-input of the video signal, wherein the operation mode switching means switches from the second operation mode to the first operation mode when the no-input detection means detects the no-input during the operation in the second operation mode.

4. The automatic gain control circuit of claim 2, further comprising a signal source switching detection means for detecting switching of a source of the video signal, wherein the operation mode switching means switches from the second operation mode to the first operation mode when, during the operation in the second operation mode, the signal source switching detection means detects switching of the signal source.

* * * * *